(12) United States Patent
Ishikawa et al.

(10) Patent No.: US 6,426,515 B2
(45) Date of Patent: Jul. 30, 2002

(54) SEMICONDUCTOR LIGHT-EMITTING DEVICE

(75) Inventors: Tsutomu Ishikawa; Hirohiko Kobayashi; Tsuyoshi Yamamoto; Hajime Shoji, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/820,929

(22) Filed: Mar. 30, 2001

(30) Foreign Application Priority Data

Apr. 21, 2000 (JP) .......................................... 2000-121436

(51) Int. Cl.[7] ........................ H01L 29/06; H01L 31/072; H01L 31/109; H01L 31/0328; H01L 31/0336
(52) U.S. Cl. ............................... 257/14; 257/17; 438/22
(58) Field of Search ............................. 257/14, 17, 79, 257/86, 80, 97, 98, 103; 438/22, 44; 372/45, 96

(56) References Cited

U.S. PATENT DOCUMENTS 5,452,318 A  9/1995  Makino et al. ............... 372/96
6,107,112 A * 8/2000  Kito et al. ..................... 438/22

OTHER PUBLICATIONS

Makino, Toshihiko; "1.55 μm High Speed Partly Gain–Coupled DFB Lasers with Periodically Etched Strained–Layer Quantum Wells"; *Int'l J High Speed Elec. and Systems*; (World Scientific Publishing Company 1997); vol. 8, No. 3, pp. 475–494.

* cited by examiner

*Primary Examiner*—David Nelms
*Assistant Examiner*—Andy Huynh
(74) *Attorney, Agent, or Firm*—Armstrong, Westerman & Hattori, LLP

(57) ABSTRACT

In a semiconductor light-emitting device including an MQW diffraction grating structure mainly used in a gain-coupled DFB laser, the ratio of the gain coupling coefficient to the index coupling coefficient is increased by making each well layer in MQW-A thicker than that in MQW-B. Each well layer and each barrier layer in the MQW structure are made of different compositions of GaInAsP. This implements a semiconductor light-emitting device with high wavelength stability, which does not induce any mode hop even during modulation with high output power or even when external optical feedback is present.

31 Claims, 9 Drawing Sheets

SEMICONDUCTOR LIGHT-EMITTING DEVICE

CROSS-REFERENCE TO RELATED APPLICATIONS

This application is based upon and claims priority of Japanese Patent Application No. 2000-121436, filed on Apr. 21, 2000, the contents being incorporated herein by reference.

BACKGROUND OF THE INVENTION

1. Field of the Invention

The present invention relates to the structures of DFB lasers capable of single-wavelength operation among semiconductor light-emitting devices principally used in optical communication systems. As the communication rate of optical communication systems is increased, semiconductor light-emitting devices having high wavelength stability are demanded. In particular, such semiconductor light-emitting devices are required to induce no mode hop even during modulation with high output power or even if external optical feedback exists.

2. Description of the Related Art

Conventionally, gain-coupled DFB lasers having periodic gain modulation in the direction of resonant cavity are proposed as a single-wavelength laser having high mode stability (such gain-coupled DFB lasers include complex-coupled DFB lasers characterized by having both of index coupling and gain coupling). Several methods are available for realizing gain modulation. Examples are a method of periodically modulating the thickness of active layers or guide layers, a method of forming periodic current-blocking layers adjacent to active layers, and a method of forming periodic light absorption layers adjacent to active layers. In particular, a structure (to be referred to as an MQW diffraction grating structure hereinafter) in which the number of multiple quantum well layers (MQW layers) as active layers is periodically changed has the advantages that a relatively large gain coupling coefficient can be ensured, the phases of gain coupling and index coupling match, and no extra absorption occurs.

FIGS. 1A to 1C show a conventional gain-coupled DFB laser using this MQW diffraction grating structure. FIG. 1A is a schematic sectional view of the main components of a semiconductor light-emitting device. FIG. 1B is a schematic sectional view of a region C in FIG. 1A. FIG. 1C shows a bandgap along a broken line D in FIG. 1B.

An MQW diffraction grating 102 includes periodically divided MQW layers (MQW-A) and flat MQW layers (MQW-B), and is formed between an n-InP substrate 101 and a p-InP cladding layer 103. The film characteristics and film thicknesses of well layers and barrier layers in MQW-A are the same as in MQW-B.

Referring to FIG. 1, of the total of six MQW layers, three upper layers are periodically divided to form MQW-A, and three lower layers are flattened to form MQW-B. In the MQW diffraction grating structure, a gain coupling coefficient, an index coupling coefficient, and the gain of the whole active layers can be controlled by changing the number of layers in each of MQW-A and MQW-B. Basically, the gain coupling coefficient and the index coupling coefficient increase when the number of layers in MQW-A is increased; the total gain of the active layers increases with no large changes in the coupling coefficients when the number of layers in MQW-B is increased.

A gain-coupled DFB laser having this MQW diffraction grating structure has the following several problems.

The first problem will be described below. In a gain-coupled DFB laser, the ratio of the gain coupling coefficient to the index coupling coefficient greatly contributes to mode stability. For example, in a uniform diffraction grating containing no phase shift in a resonant cavity, it is generally desirable that the ratio of the gain coupling coefficient to the index coupling coefficient be large. The values of these two coupling coefficients have influence on other various characteristics. For example, if these coupling coefficients are large, generally the lasing threshold current becomes small and the resistance to external optical feedback becomes high, but the slope efficiency lowers and the influence of the spatial hole-burning effect increases. Accordingly, it is desirable to control appropriately both the index coupling coefficient and the gain coupling coefficient in accordance with required device characteristics.

Unfortunately, in the conventional MQW diffraction grating structure shown in FIG. 1, the number of layers in MQW-A contributes to both the gain coupling coefficient and the index coupling coefficient. This makes it difficult to control these parameters independently. For example, if the number of layers in MQW-A is increased to increase the gain coupling coefficient, the index coupling coefficient increases at the same time. Consequently, the slope efficiency lowers, or the spatial hole-burning effect becomes strong.

The second problem of the conventional MQW diffraction grating structure shown in FIG. 1 is as follows. That is, when a differential gain (a change in gain with a change in carrier density) is increased to increase a modulation bandwidth, the dependence of the gain on the carrier density, i.e., the dependence of the gain coupling coefficient on the carrier density increases in MQW-A. This increases variations in the gain coupling coefficient during modulation.

The third problem of the conventional diffraction grating structure shown in FIG. 1 will be described below. When strain is introduced in MQW layers, this strain enters in different ways into layers of MQW-A and MQW-B (see FIG. 2), even if these layers have the same composition (i.e., the same lattice constant). This produces a difference between the gain spectra in MQW-A and MQW-B. For example, when compressive strain is introduced, the gain peak in MQW-A shifts to a shorter wavelength than in MQW-B; when tensile strain is introduced, the gain peak in MQW-A shifts to a longer wavelength than in MQW-B. When this is the case, it is difficult to set properly the gain peak position with respect to the lasing wavelength that is determined by the diffraction grating period. As an example, if the gain peak wavelength is too far from the lasing wavelength, the lasing threshold current increases, or the temperature characteristics deteriorate.

SUMMARY OF THE INVENTION

It is an object of the present invention to control independently the index coupling coefficient and the gain coupling coefficient and improve the mode stability without deteriorating the characteristics such as the lasing threshold current, slope efficiency, and the resistance to external optical feedback, in a semiconductor light-emitting device of a gain-coupled DFB laser using the MQW diffraction grating structure.

It is another object of the present invention to provide a semiconductor light-emitting device having the MQW diffraction grating structure, which has less dependence of the gain coupling coefficient on the carrier density while keeping the total differential gain of the active layers large, so as to achieve a large modulation bandwidth, and less wavelength variation during modulation.

It is still another object of the present invention to provide a semiconductor light-emitting device which, even if strain is introduced in multiple quantum well layers, can match the gain peak wavelength of first multiple quantum well layers (MQW-A) with that of second multiple quantum well layers (MQW-B), and which can appropriately set the gain peak position with respect to the lasing wavelength that is determined by the diffraction grating period, thereby preventing an increase in the lasing threshold current or deterioration of the temperature characteristics.

The present invention provides a semiconductor light-emitting device having a multiple quantum well structure (MQW structure) in which well layers are stacked via barrier layers, and which amplifies light by current injection, characterized in that the number of barrier layers and the number of well layers periodically change in the propagation direction of light in a partial region or the whole region of the multiple quantum well structure, and that the multiple quantum well structure comprises, in the region, first multiple quantum well layers (MQW-A) divided in the propagation direction of light by a period which is an integral multiple of the half wavelength of the propagating light in a medium, and second flat multiple quantum well layers (MQW-B), and that at least one of the film characteristics and film thickness of at least one of the barrier layers and the well layers in the first multiple quantum well layers is controlled to a desired condition different from that in the second multiple quantum well layers.

In this semiconductor light-emitting device, periodic gain modulation exists in the propagation direction of light and generates distributed feedback with respect to propagating light.

More specifically, in this semiconductor light-emitting device, periodic gain modulation and index modulation coexist in the propagation direction of light, and both the gain modulation and index modulation generate distributed feedback with respect to propagating light.

Furthermore, the difference of the film characteristics is achieved by controlling at least one of the material composition, doping with p- or n-type impurities, and introduction of compressive strain or tensile strain.

The relationships between the above modes of the present invention and the first to third problems described previously will be explained below.

To solve the first problem, the present invention can control the ratio of the gain coupling coefficient to the index coupling coefficient by making the structures of the well layers and/or the barrier layers in MQW-A different from those in MQW-B as described above. For example, the well layers in MQW-B are made thinner than the well layers in MQW-A. In this case, the quantum level in MQW-B shifts to higher energy than in MQW-A. This increases the ratio of the number of carriers injected into MQW-A to the number of carriers injected into MQW-B. Accordingly, the ratio of the gain of MQW-A to the total gain of the active layers increases, and this increases the gain coupling coefficient. On the other hand, the refractive index of MQW-A is lowered by this increase in the number of carriers, and this decreases the index coupling coefficient.

It leads to the same effect that the material compositions of the well layers in MQW-A and MQW-B are made different from each other to make the bandgap of the well layers in MQW-B larger than that of the well layers in MQW-A. The same effect can be expected by making the barrier height of the barrier layers in MQW-B higher than that of the barrier layers in MQW-A. It is also possible to decrease the gain coupling coefficient and increase the index coupling coefficient by switching the above structures of MQW-A and MQW-B.

To solve the second problem, in the present invention, the differential gain (the ratio of a change in the gain to a change in the carrier density) with respect to the lasing wavelength that is determined by the diffraction grating period is decreased in MQW-A and increased in MQW-B. In this manner, the dependence of the gain coupling coefficient on the carrier density is decreased while the differential gain of the whole active layers is kept large. For example, the gain peak wavelength of MQW-A is shifted to a shorter wavelength, and that of MQW-B is shifted to a longer wavelength, with respect to the lasing wavelength that is determined by the diffraction grating period. In this case, the differential gain is small in MQW-A because the lasing wavelength is longer than the gain peak wavelength. In contrast, the differential gain is large in MQW-B since the lasing wavelength is shorter than the gain peak wavelength.

Examples of means for setting the gain peak wavelengths in the above positions are: making the well layers in MQW-A thinner than the well layers in MQW-B; making the bandgap of the well layers in MQW-A larger than that of the well layers in MQW-B; and making the barrier height of the barrier layers in MQW-A higher than that of the barrier layers in MQW-B.

Even when the positions of the gain peaks in MQW-A and MQW-B with respect to the lasing wavelength do not satisfy the above relationship, it is possible to decrease the differential gain in MQW-A and increase the differential gain in MQW-B by appropriately designing the structures of the two MQW layers. For example, the differential gain in MQW-A can be decreased by introducing tensile strain in the well layers in MQW-A or doping MQW-A with n-type impurities. Also, the differential gain in MQW-B can be increased by introducing compressive strain in MQW-B or doping MQW-B with p-type impurities.

To solve the third problem, the present invention matches the gain peak wavelengths in MQW-A and MQW-B by making the structures of the well layers and/or the barrier layers in MQW-A different from those in MQW-B. For example, when compressive strain is to be introduced in both of MQW-A and MQW-B, the well layers in MQW-A are made thicker than the well layers in MQW-B so that the gain peak wavelengths in MQW-A and MQW-B match in accordance with the strain amount. When this is the case, the quantum level in MQW-A shifts to a longer wavelength because the film thickness is increased. This makes it possible to cancel the difference between the gain peak wavelengths in MQW-A and MQW-B produced by the difference between the ways the strain enters.

Also, even when compressive strain is to be similarly introduced, the same effect can be expected by setting, in accordance with the strain amount, the composition of the well layers in MQW-A such that the light emission wavelength when MQW-A is kept undivided is longer than that of MQW-B.

Additionally, even when compressive strain is to be similarly introduced, the same effect can be expected by making the barrier height of the barrier layers in MQW-A lower than that of the barrier layers in MQW-B in accordance with the strain amount. When tensile strain is to be introduced, on the other hand, the same effect can be expected by switching the structures of MQW-A and MQW-B in the above examples. Furthermore, when compressive strain or tensile strain is to be introduced, the same effect can be expected by setting the strain amount in MQW-B to be larger than the strain amount in MQW-A when MQW-A is kept undivided, in accordance with the strain amount in MQW-A.

When the present invention is applied to the first problem, it is possible to control independently the index coupling coefficient and the gain coupling coefficient in a semiconductor light-emitting device having an MQW diffraction grating structure. Accordingly, the mode stability can be improved without deteriorating the characteristics such as the lasing threshold current, slope efficiency, and the resistance to external optical feedback.

When the present invention is applied to the second problem, the dependence of the gain coupling coefficient on the carrier density can be decreased while the differential gain of the whole active layers is kept large. Accordingly, it is possible to implement a semiconductor light-emitting device with an MQW diffraction grating structure, which has a large modulation bandwidth and varies the gain coupling coefficient little during modulation.

When the present invention is applied to the third problem, the gain peak wavelengths of MQW-A and MQW-B can be matched even when strain is introduced in these MQW layers in a semiconductor light-emitting device with an MQW diffraction grating structure. As a consequence, the gain peak positions can be appropriately set with respect to the lasing wavelength determined by the diffraction grating period. This makes it possible to prevent an increase in the lasing threshold current and deterioration of the temperature characteristics.

In the semiconductor light-emitting device of the present invention, the index coupling coefficient and the gain coupling coefficient can be independently controlled. Therefore, the mode stability can be improved without deteriorating the characteristics such as the lasing threshold current, slope efficiency, and the resistance to external optical feedback.

Also, the dependence of the gain coupling coefficient on the carrier density can be decreased while the differential gain of the whole active layers is kept large. This makes it possible to increase the modulation bandwidth and decrease the wavelength variation during modulation.

Furthermore, even when strain is introduced in multiple quantum well layers, the gain peak wavelengths of first and second multiple quantum well layers can be matched. Consequently, the gain peak positions can be appropriately set with respect to the lasing wavelength determined by the diffraction grating period. Hence, it is possible to prevent an increase in the lasing threshold current and deterioration of the temperature characteristics.

As described above, the present invention can improve the various characteristics of a semiconductor light-emitting device and thereby implement a semiconductor light-emitting device with high wavelength stability, which does not induce any mode hop even during modulation with high output power or even when external optical feedback is present.

DETAILED DESCRIPTION OF THE PREFERRED EMBODIMENTS

Hereinafter, several specific embodiments of the present invention will be described in detail with reference to drawings.

(First Embodiment)

Figure 1A:
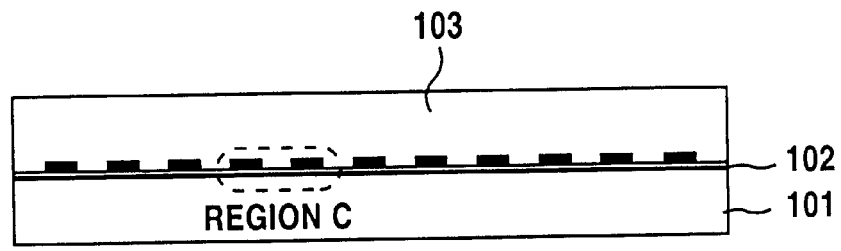
FIG. 1A is a schematic sectional view of the major components of a semiconductor light-emitting device having a conventional MQW diffraction grating structure.
Figure 1B:
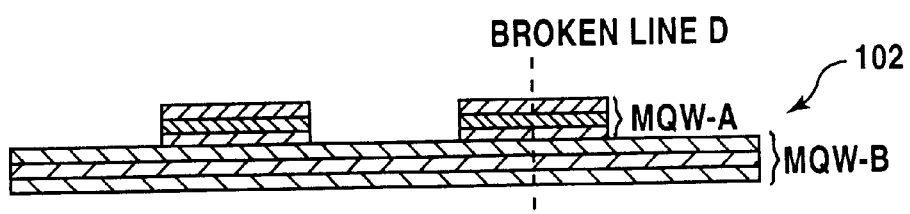
FIG. 1B is a schematic sectional view of a region C in FIG. 1A.
Figure 1C:
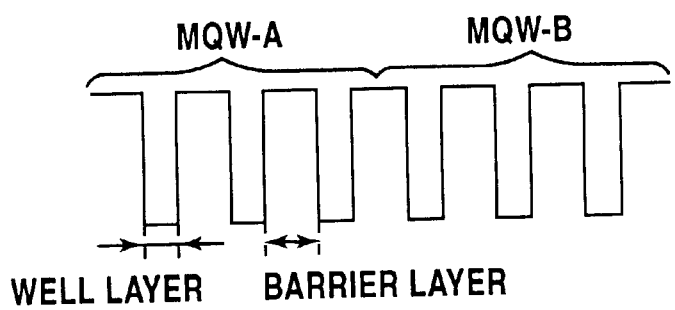
FIG. 1C is a bandgap diagram taken along a broken line D in FIG. 1B.
Figure 2:
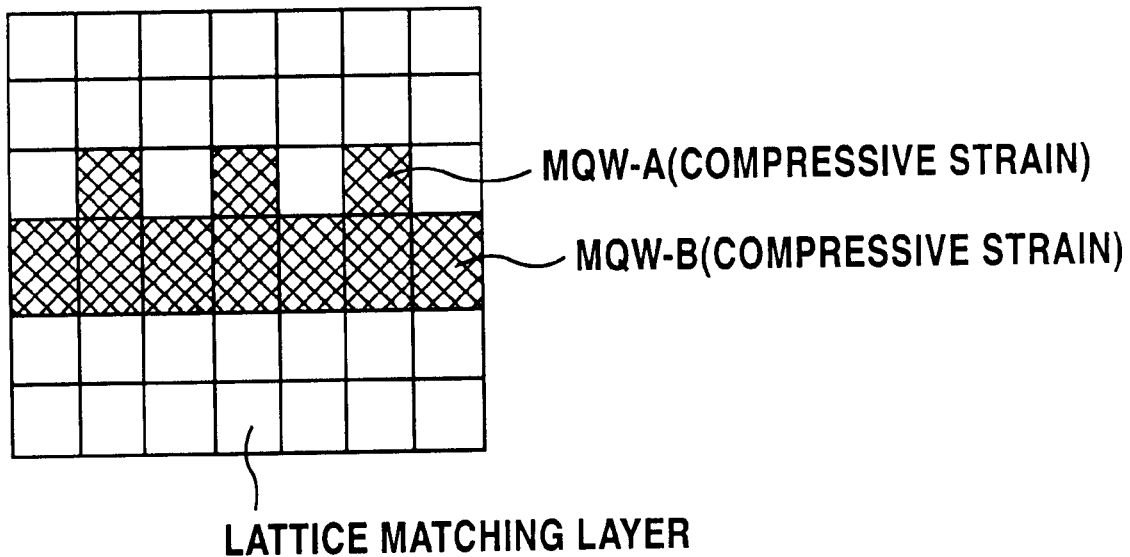
FIG. 2 is a conceptional view showing the way strain enters the conventional MQW diffraction grating.
Figure 3A:
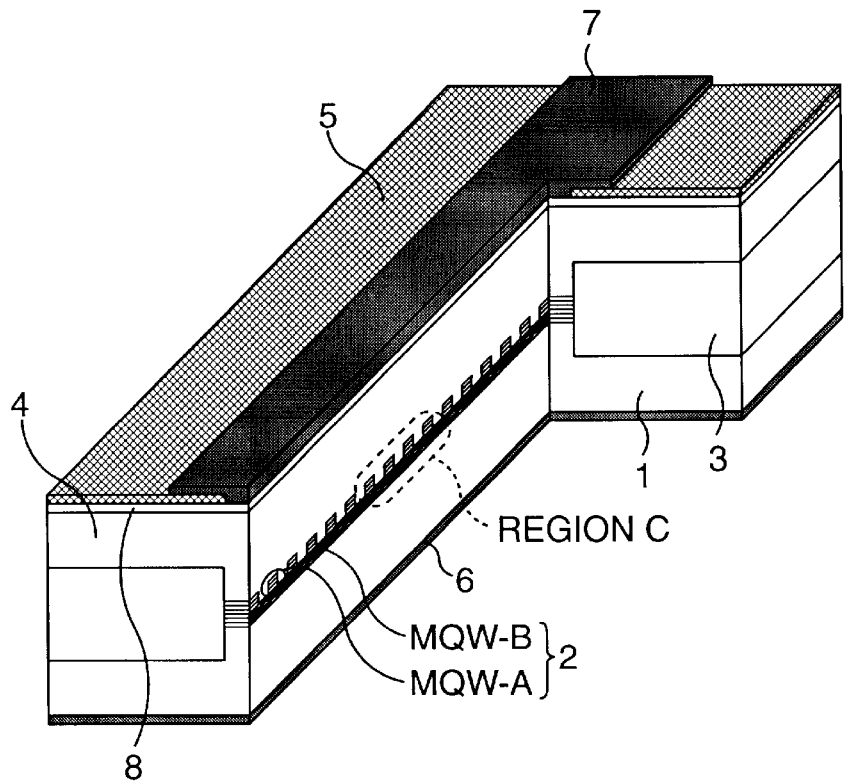
FIG. 3A is a schematic perspective view of the main parts of a semiconductor light-emitting device according to the first embodiment of the present invention.
Figure 3B:
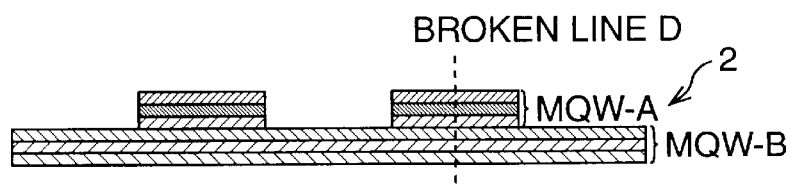
FIG. 3B is a schematic sectional view of a region C in FIG. 3A.
Figure 3C:
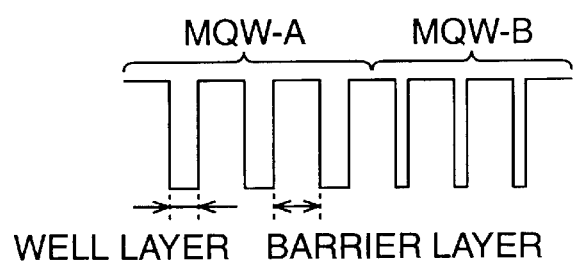
FIG. 3C is a bandgap diagram taken along a broken line D in FIG. 3B.

FIGS. 3A to 3C are for explaining a semiconductor light-emitting device according to the first embodiment of the present invention. FIG. 3A shows a schematic sectional view of the main parts of the semiconductor light-emitting device. FIG. 3B shows a schematic sectional view of a region C in FIG. 3A. FIG. 3C shows a bandgap diagram taken along a broken line D in FIG. 3B.

This semiconductor light-emitting device is principally used in a gain-coupled DFB laser. As shown in FIG. 3A, a multiple quantum well structure (MQW structure) 2 for amplifying light by current injection and a current constraint layer 3 are formed on an n-InP substrate 1. A p-InP cladding layer 4 is formed to cover the MQW structure 2 and the current constraint layer 3. An $SiO_2$ passivation layer 5 is formed on the upper surface, and an n-side electrode 6 is formed on the lower surface. In addition, a p-side electrode 7 is formed on the upper surface so as to be electrically connected to a contact layer 8.

In the MQW structure 2, well layers are stacked via barrier layers. As shown in FIG. 3B, this MQW structure 2 includes, in a part or the whole of its region, first multiple quantum well layers (MQW-A) divided in the propagation direction of light at a period which is an integral multiple of the half wavelength of the propagating light in a medium, and second flat multiple quantum well layers (MQW-B).

In this embodiment, the ratio of the gain coupling coefficient to the index coupling coefficient is increased by making the well layers in MQW-A thicker than the well layers in MQW-B. The well layers and barrier layers in the MQW structure 2 are formed by GaInAsP having different compositions. The well layer thickness in MQW-A is 10 nm, and that in MQW-B is 8 nm. The wavelength corresponding to the bandgap energy in a bulk state of the barrier layers, i.e., the composition wavelength of the barrier layers is 1.2 μm, and the thickness of the barrier layers is 10 nm. The composition of the well layers is so set that the gain peak wavelength of the whole MQW structure is 1.56 μm. The diffraction grating period is set at 240 nm in accordance with a lasing wavelength of 1.55 μm. This diffraction grating is a uniform diffraction grating having no phase shift.

A method of fabricating the semiconductor light-emitting device of this embodiment will be described in the order of steps with reference to FIGS. 4A to 5E.

FIGS. 4A to 4D are sectional views of MQW layers cut along a plane parallel with the resonant cavity direction. FIGS. 5A to 5E are sectional views cut along a plane perpendicular to the resonant cavity direction.

First, MQW-B, MQW-A (the MQW structure 2 is formed by MQW-A and MQW-B), and a p-InP cladding layer 4 are sequentially grown on an n-InP substrate 1 (FIG. 4A) by MO-VPE or the like. The film thicknesses and film characteristics of layers constituting MQW-A and MQW-B are appropriately set in accordance with means for implementing the present invention.

Note that at least one or more optical waveguide layers and the like can also be grown, if necessary, in addition to the MQW structure 2, although these layers are omitted in this embodiment. Note also that the number of layers in each of MQW-A and MQW-B can be any arbitrary number.

Figure 4A:
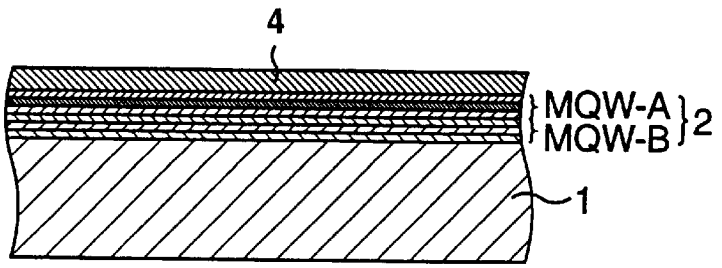
FIGS. 4A to 4D are sectional views showing MQW layers cut along a plane parallel with the resonant cavity direction.
Figure 4B:
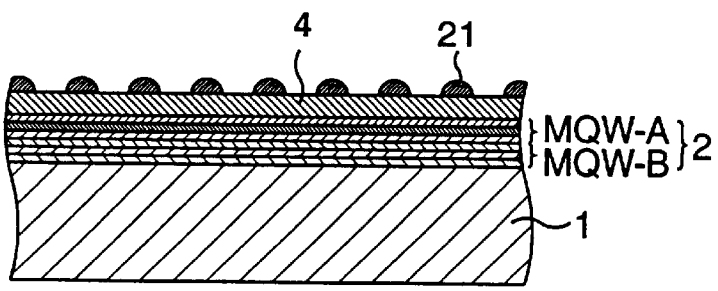

Subsequently, the MQW structure 2 thus grown is coated with a resist, and a resist diffraction grating 21 is formed using a holographic lithography or an electron beam lithography (FIG. 4B). Although a uniform diffraction grating is used in this embodiment, at least one or more phase shifts can also be formed if necessary.

Figure 4C:
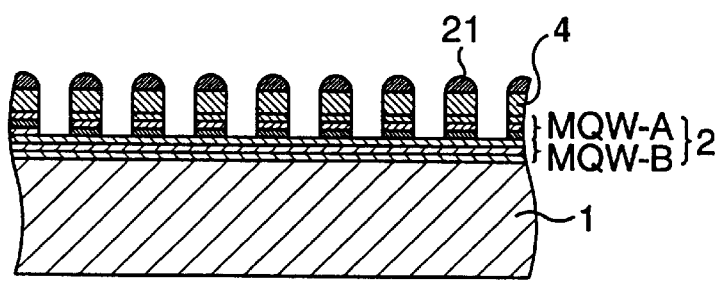

The formed resist diffraction grating 21 is used as a mask to etch away a portion from the surface to MQW-A 11 (FIG. 4C).

Figure 4D:
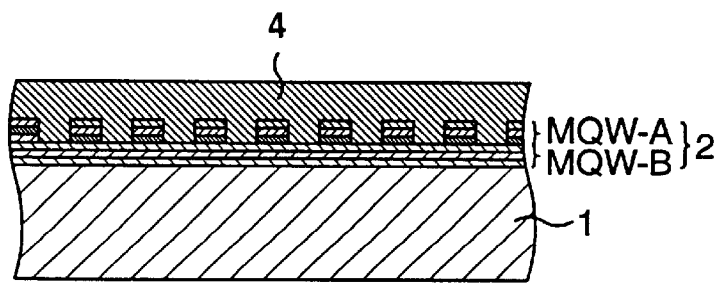

After the resist diffraction grating is removed, a p-InP cladding layer 4 is grown so as to bury MQW-A (FIG. 4D). The material of this burying growth layer is not limited to p-InP. Also, at least one or more optical waveguide layers and the like can be grown as needed.

Figure 5A:
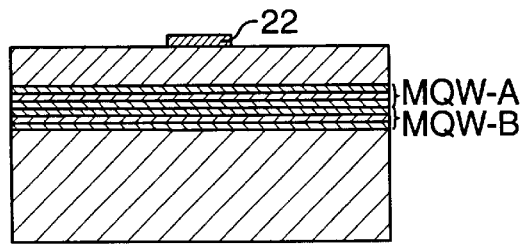
FIGS. 5A to 5E are sectional views cut along a plane perpendicular to the resonant cavity direction.

Subsequently, general photolithography is used to form a stripe $SiO_2$ mask 22 parallel to the resonant cavity direction (FIG. 5A).

Figure 5B:
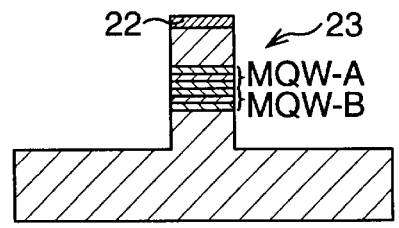

This $SiO_2$ mask 22 is used to perform dry-etching or the like, thereby forming a mesa stripe 23 reaching a lower portion (a surface layer of the n-InP substrate 1) of the MQW structure 2 (FIG. 5B).

Figure 5C:
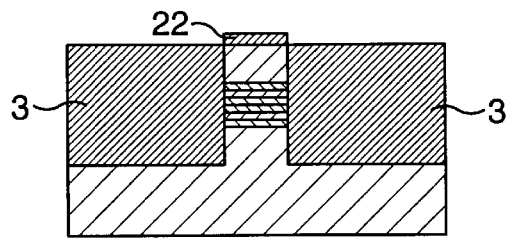

Current constraint layers 3 are grown on the two sides of the mesa stripe 23 by MO-VPE or the like (FIG. 5C). In this embodiment, p- and n-InP layers are sequentially formed as the current constraint layers 3. However, some other arrangement can also be used. Furthermore, it is possible to preferably use another waveguide structure such as a ridge-waveguide structure or buried ridge-waveguide structure different from this embodiment.

Figure 5D:
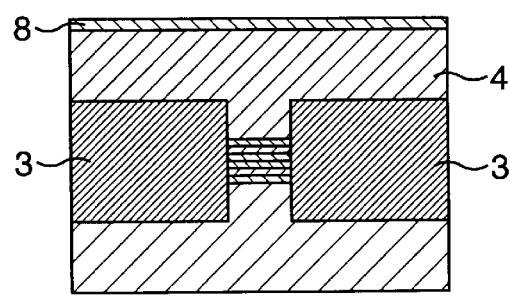

After the $SiO_2$ mask 22 is removed, a p-InP cladding layer 4 and a p-GaInAsP contact layer 8 are grown in this order by MO-VPE or the like (FIG. 5D).

Figure 5E:
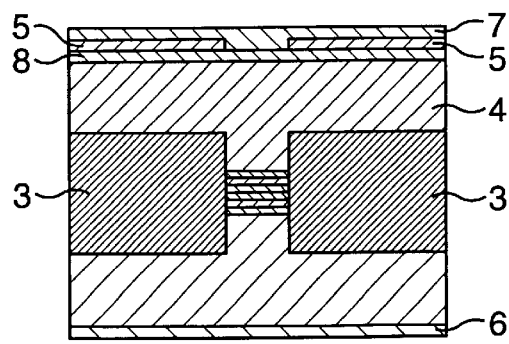

Subsequently, general photolithography is used to form an $SiO_2$ passivation film 5, a p-side electrode 7, and an n-side electrode 6 (FIG. 5E).

In this embodiment, an n-type substrate (the n-InP substrate 1) is used as a substrate. However, a p-type substrate can also be used by inverting the conductivity type of each corresponding layer. Also, the positions of MQW-A and MQW-B can be vertically switched by growing MQW-A first and then growing MQW-B after the burying growth of the p-InP cladding layer 4.

The front facet of the semiconductor light-emitting device fabricated through the above steps was coated with an antireflection film, the rear facet of the device was coated with a high-reflection film, and the resonant cavity length of the device was set at 300 μm. In this device, the lasing threshold current was 4 mA, and the slope efficiency was 0.4 W/A. The single-wavelength yield of 100 devices of one wafer was 100%. Even when external optical feedback of −14 dB existed, no mode hop occurred.

As described above, the semiconductor light-emitting device of this embodiment makes it possible to control independently the index coupling coefficient and the gain coupling coefficient, and improve the mode stability without deteriorating the characteristics such as the lasing threshold current, slope efficiency, and the resistance to external optical feedback.

(Second Embodiment)

Figure 6A:
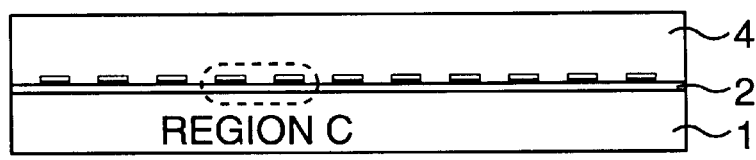
FIG. 6A is a schematic sectional view of the main components of a semiconductor light-emitting device according to the second embodiment of the present invention.
Figure 6B:
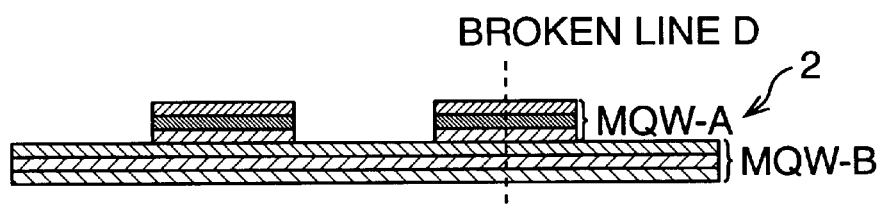
FIG. 6B is a schematic sectional view of a region C in FIG. 6A.
Figure 6C:
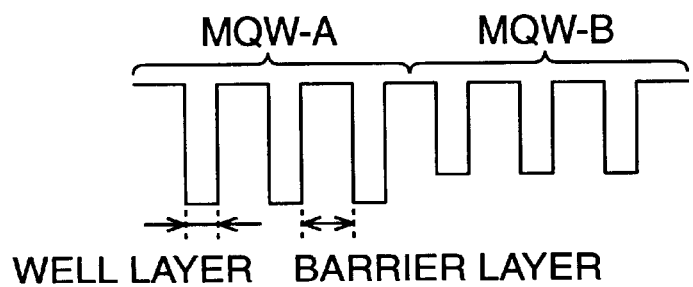
FIG. 6C is a bandgap diagram taken along a broken line D in FIG. 6B.

FIGS. 6A to 6C are for explaining a semiconductor light-emitting device according to the second embodiment of the present invention. FIG. 6A shows a schematic sectional view of the major components of the semiconductor device. FIG. 6B shows a schematic sectional view of a region C in FIG. 6A. FIG. 6C shows a bandgap diagram taken along a broken line D in FIG. 6B. The whole configuration of the semiconductor light-emitting device of this embodiment is substantially the same as that of the first embodiment.

In this embodiment, the ratio of the gain coupling coefficient to the index coupling coefficient is increased by making the bandgap of well layers in MQW-B larger than that of well layers in MQW-A. This can be achieved by making the compositions of well layers in MQW-A and MQW-B different from each other.

The well layer thickness is 10 nm in both MQW-A and MQW-B. GaInAsP having a composition wavelength of 1.65 μm is used in MQW-A, and GaInAsP having a composition wavelength of 1.63 μm is used in MQW-B. In both MQW-A and MQW-B, barrier layers are made of GaInAsP having a thickness of 10 nm and a composition wavelength of 1.2 μm.

Similar to the first embodiment, the semiconductor light-emitting device of this embodiment achieved a high wavelength yield and a good resistance to external optical feedback without deteriorating the lasing threshold current and the slope efficiency.

As described above, the semiconductor light-emitting device of this embodiment makes it possible to control independently the index coupling coefficient and the gain coupling coefficient, and improve the mode stability without deteriorating the characteristics such as the lasing threshold current, slope efficiency, and the resistance to external optical feedback.

(Third Embodiment)

Figure 7:
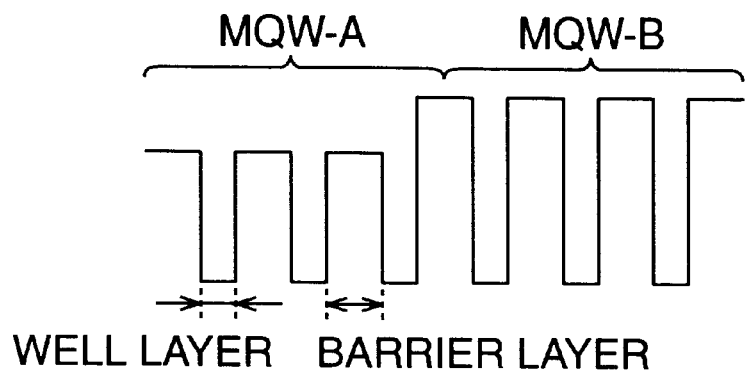
FIG. 7 is a bandgap diagram of the MQW structure of a semiconductor light-emitting device according to the third embodiment of the present invention.

FIG. 7 shows a bandgap diagram of the MQW structure of a semiconductor light-emitting device according to the third embodiment of the present invention. The whole configuration of the semiconductor light-emitting device of this embodiment is substantially the same as that of the first embodiment.

In this embodiment, the ratio of the gain coupling coefficient to the index coupling coefficient is increased by making the barrier height of barrier layers in MQW-B higher than that of barrier layers in MQW-A. In both MQW-A and MQW-B, well layers are made of GaInAsP having a thickness of 10 nm and a composition wavelength of 1.65 $\mu$m. Barrier layers in MQW-A are made of GaInAsP having a thickness of 10 nm and a composition wavelength of 1.25 $\mu$m. Barrier layers in MQW-B are made of GaInAsP having a thickness of 10 nm and a composition wavelength of 1.15 $\mu$m.

Similar to the first embodiment, the semiconductor light-emitting device of this embodiment achieved a high wavelength yield and good resistance to external optical feedback without deteriorating the lasing threshold current and the slope efficiency.

As described above, the semiconductor light-emitting device of this embodiment makes it possible to control independently the index coupling coefficient and the gain coupling coefficient, and improve the mode stability without deteriorating the characteristics such as the lasing threshold current, slope efficiency, and the resistance to external optical feedback.

(Fourth Embodiment)

Figure 8:
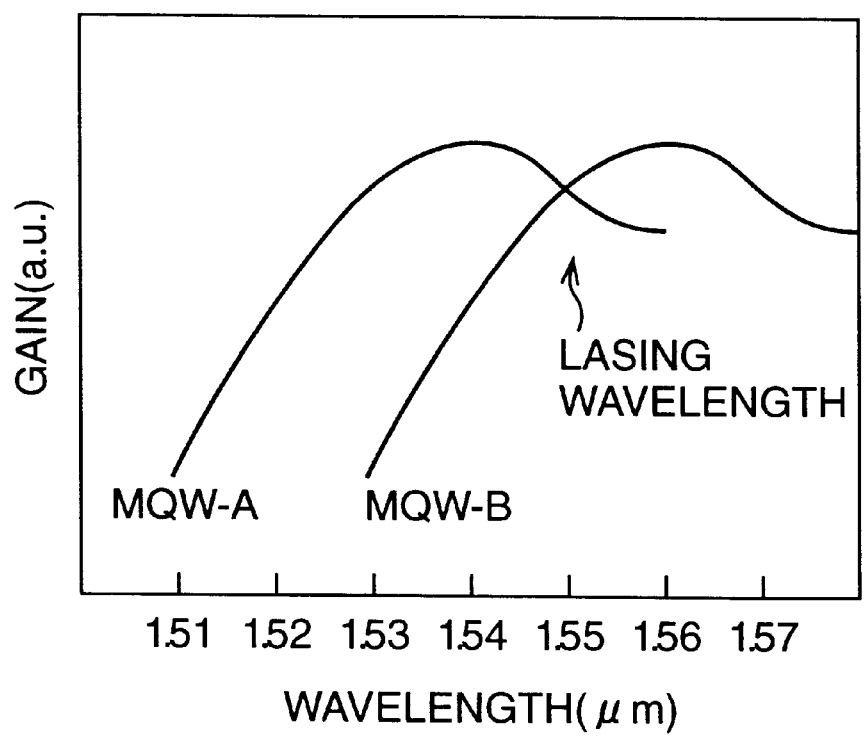
FIG. 8 is a graph showing the gain curves of first and second MQW layers in a semiconductor light-emitting device according to the fourth embodiment of the present invention.

FIG. 8 is a graph showing the gain curves of first and second MQW layers in a semiconductor light-emitting device according to the fourth embodiment of the present invention. The whole configuration of the semiconductor light-emitting device of this embodiment is substantially the same as that of the first embodiment.

In this embodiment, the gain peak wavelengths of MQW-A and MQW-B are shifted to shorter and longer wavelengths, respectively, with respect to the lasing wavelength determined by the diffraction grating period. In this manner, the dependence of the gain coupling coefficient on the carrier density is decreased while the differential gain of the entire MQW structure is kept large. The period of the diffraction grating was set at 240 nm in accordance with a lasing wavelength of 1.55 $\mu$m. The gain peak wavelengths of MQW-A and MQW-B were set at 1.54 $\mu$m and 1.56 $\mu$m, respectively.

In this semiconductor light-emitting device fabricated by a method analogous to the fabrication method shown in FIGS. 4A to 5E, the relaxation oscillation frequency was 20 GHz, no mode hop occurred during direct modulation at 10 Gb/s, and the wavelength variation was 0.3 nm or less.

As described above, the semiconductor light-emitting device of this embodiment makes it possible to decrease the dependence of the gain coupling coefficient on the carrier density while a large differential gain of the whole active layers is maintained, thereby increasing the modulation bandwidth and decreasing the wavelength variation during modulation.

(Fifth Embodiment)

Figure 9:
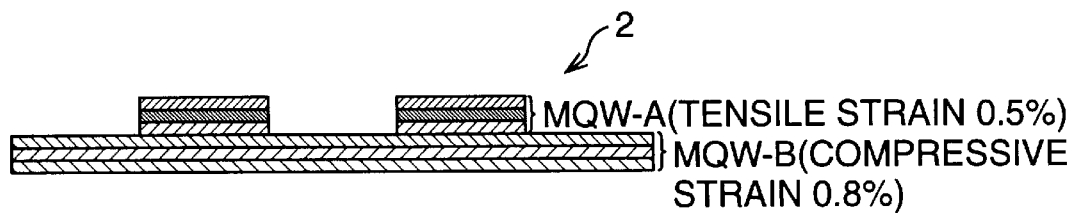
FIG. 9 is a schematic sectional view showing, in an enlarged scale, the MQW structure and its vicinity of a semiconductor light-emitting device according to the fifth embodiment of the present invention.

FIG. 9 is a schematic sectional view showing, in an enlarged scale, the MQW structure and its vicinity of a semiconductor light-emitting device according to the fifth embodiment of the present invention. The whole configuration of the semiconductor light-emitting device of this embodiment is substantially the same as that of the first embodiment.

In this embodiment, tensile strain is introduced in well layers in MQW-A, and compressive strain is introduced to well layers in MQW-B. In this way, the dependence of the gain coupling coefficient on the carrier density is decreased while the differential gain of the whole active layers is kept large. Well layers in MQW-A are made of 20 nm-thick GaInAsP, and a tensile strain of 0.5% is introduced in these layers. Well layers in MQW-B are made of 5 nm-thick GaInAsP, and a compressive strain of 0.8% is introduced in these layers. The compositions of these well layers are so adjusted that their respective peak gain wavelengths are 1.55 $\mu$m.

Similar to the fourth embodiment, in the semiconductor light-emitting device of this embodiment, the wavelength variation during modulation could be decreased while a broad modulation bandwidth was maintained.

As described above, the semiconductor light-emitting device of this embodiment makes it possible to decrease the dependence of the gain coupling coefficient on the carrier density while a large differential gain of the whole active layers is maintained, thereby increasing the modulation bandwidth and decreasing the wavelength variation during modulation.

(Sixth Embodiment)

Figure 10:
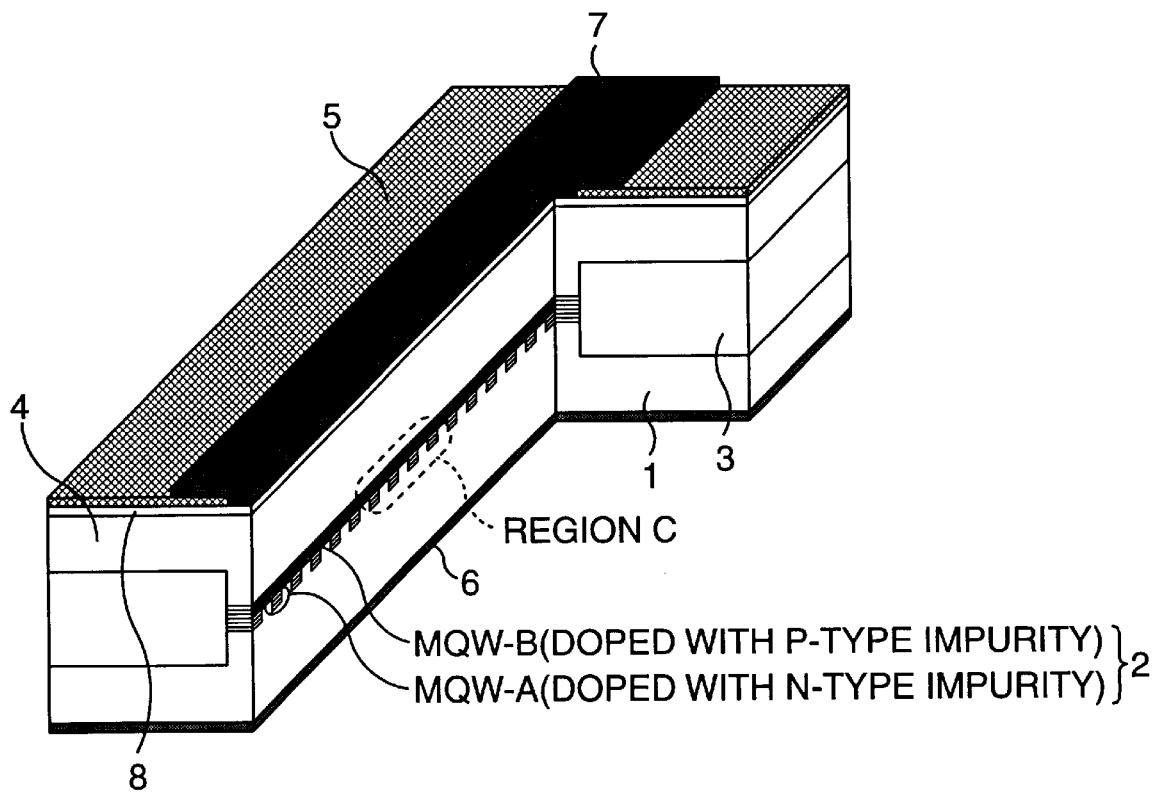
FIG. 10 is a schematic perspective view showing the major parts of a semiconductor light-emitting device according to the sixth embodiment of the present invention.

FIG. 10 is a schematic perspective view showing the major components of a semiconductor light-emitting device according to the sixth embodiment of the present invention. The whole configuration of the semiconductor light-emitting device of this embodiment is substantially the same as that of the first embodiment.

In this embodiment, MQW-A is doped with n-type impurities, and MQW-B is doped with p-type impurities. In this manner, the dependence of the gain coupling coefficient on the carrier density is decreased while the differential gain of the whole active layers is kept large. In this embodiment, an n-InP substrate 1 is used, and MQW-A is formed below MQW-B. When a p-InP substrate is used, however, MQW-A is formed above MQW-B as in the previous embodiments.

Similar to the fourth embodiment, in the semiconductor light-emitting device of this embodiment, the wavelength variation during modulation could be decreased while a broad modulation bandwidth was maintained.

As described above, the semiconductor light-emitting device of this embodiment makes it possible to decrease the dependence of the gain coupling coefficient on the carrier density while a large differential gain of the whole active layers is maintained, thereby increasing the modulation bandwidth and decreasing the wavelength variation during modulation.

(Seventh Embodiment)

Figure 11:
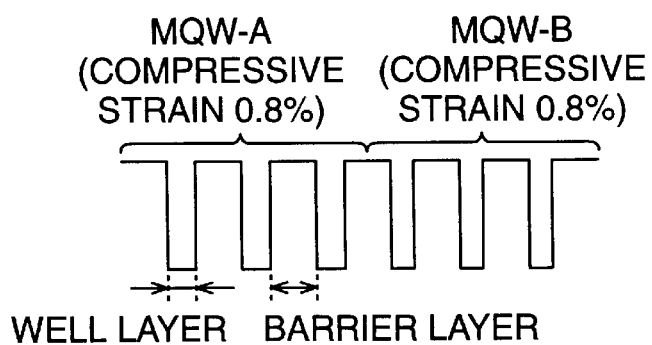
FIG. 11 is a bandgap diagram of the MQW structure of a semiconductor light-emitting device according to the seventh embodiment of the present invention.

FIG. 11 shows a bandgap diagram of the MQW structure of a semiconductor light-emitting device according to the seventh embodiment of the present invention. The whole configuration of the semiconductor light-emitting device of this embodiment is substantially the same as that of the first embodiment.

In this embodiment, compressive strain is introduced in both of MQW-A and MQW-B. In accordance with the strain amount, the well layer thickness in MQW-A is made thicker than that in MQW-B, thereby matching the gain peak wavelengths of MQW-A and MQW-B. In this embodiment, the well layer thicknesses in MQW-A and MQW-B were set to 5.7 nm and 5 nm, respectively, with respect to a compressive strain of 0.8%. The gain peak wavelength was 1.56 μm in both MQW-A and MQW-B; detune from a lasing wavelength of 1.55 μm determined by the diffraction grating period was 10 nm.

As described above, the semiconductor light-emitting device of this embodiment makes it possible to match the gain peak wavelengths of MQW-A and MQW-B even when strain is introduced in MQW layers, and as a consequence appropriately set the gain peak position with respect to the lasing wavelength that is determined by the diffraction grating period, thereby preventing an increase in the lasing threshold current and deterioration of the temperature characteristics.

(Eighth Embodiment)

Figure 12:
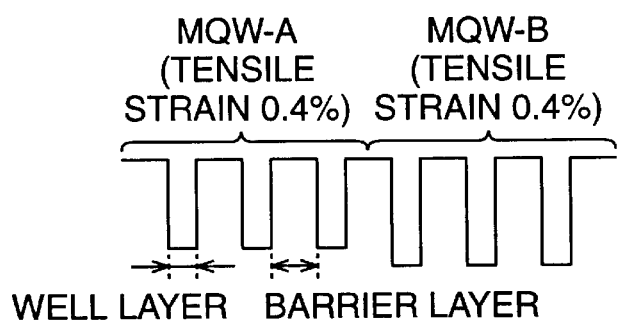
FIG. 12 is a bandgap diagram of the MQW structure of a semiconductor light-emitting device according to the eighth embodiment of the present invention.

FIG. 12 shows a bandgap diagram of the MQW structure of a semiconductor light-emitting device according to the eighth embodiment of the present invention. The whole configuration of the semiconductor light-emitting device of this embodiment is substantially the same as that of the first embodiment.

In this embodiment, tensile strain is introduced in both of MQW-A and MQW-B. In accordance with the strain amount, the composition of well layers in MQW-A is set such that the light emission wavelength when this MQW-A is not divided by etching is shorter than that of MQW-B. In this manner, the gain peak wavelengths of MQW-A and MQW-B are matched. In this embodiment, the composition of well layers in MQW-A was so set that the light emission wavelength when this MQW-A was kept undivided was shorter by 10 nm than that of MQW-B, with respect to a tensile strain of 0.4%. In this case, the gain peak wavelengths of MQW-A and MQW-B were matched, and they could be matched with the lasing wavelength determined by the diffraction grating period.

As described above, the semiconductor light-emitting device of this embodiment makes it possible to match the gain peak wavelengths of MQW-A and MQW-B even when strain is introduced in MQW layers, and as a consequence appropriately set the gain peak position with respect to the lasing wavelength that is determined by the diffraction grating period, thereby preventing an increase in the lasing threshold current and deterioration of the temperature characteristics.

(Ninth Embodiment)

Figure 13:
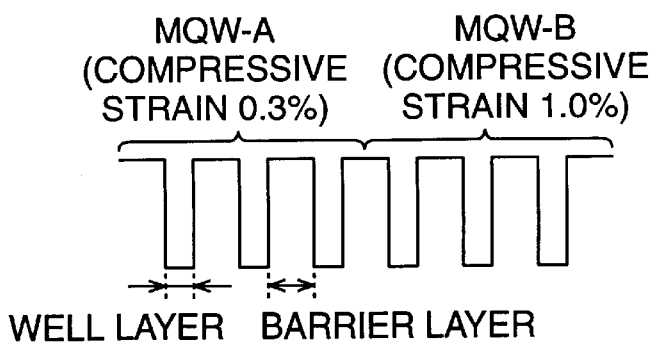
FIG. 13 is a bandgap diagram of the MQW structure of a semiconductor light-emitting device according to the ninth embodiment of the present invention.

FIG. 13 shows a bandgap diagram of the MQW structure of a semiconductor light-emitting device according to the ninth embodiment of the present invention. The whole configuration of the semiconductor light-emitting device of this embodiment is substantially the same as that of the first embodiment.

In this embodiment, compressive strain is introduced in both of MQW-A and MQW-B. The strain amount in MQW-B is set to be larger than the strain amount in MQW-A when MQW-A is not divided by etching. In this manner, the gain peak wavelengths of MQW-A and MQW-B are matched. In this embodiment, the well layer thickness was set to 4 nm and the well layer composition wavelength was set to 1.73 μm in both MQW layers. Also, the compressive strain in MQW-A when MQW-A was kept undivided was set to 0.3%, and the compressive strain in MQW-B was set to 1.0%. Under the conditions, the gain peak wavelengths of MQW-A and MQW-B were matched, and they could be matched with the lasing wavelength determined by the diffraction grating period.

As described above, the semiconductor light-emitting device of this embodiment makes it possible to match the gain peak wavelengths of MQW-A and MQW-B even when strain is introduced in MQW layers, and as a consequence appropriately set the gain peak position with respect to the lasing wavelength that is determined by the diffraction grating period, thereby preventing an increase in the lasing threshold current and deterioration of the temperature characteristics.

Each embodiment described above has explained a semiconductor light-emitting device for use in a gain-coupled DFB laser in which periodic gain modulation and index modulation coexist in the propagation direction of light, and both the gain modulation and the index modulation generate distributed feedback for propagating light. However, the present invention is not limited to these embodiments. For example, the present invention is also applicable to a gain-coupled DFB laser in which periodic gain modulation exists in the propagation direction of light and this gain modulation generates distributed feedback for propagating light.

What is claimed is:

1. A semiconductor light-emitting device including a multiple quantum well structure for amplifying a light by current injection, said structure comprising well layers and barrier layers interposed between said well layers, wherein the number of well and barrier layers periodically changes in the light propagation direction in a partial or the whole region of said multiple quantum well structure, said multiple quantum well structure comprises, in said region, first multiple quantum well layers divided in said light propagation direction at a period corresponding to an integral multiple of the half wavelength of a propagating light in a medium, and second flat multiple quantum well layers, and at least one of the film characteristics and the film thickness of at least one of each barrier layer and each well layer in said first multiple quantum well layers is different from that in said second multiple quantum well layers.

2. The device according to claim 1, wherein periodic gain modulation exists in said light propagation direction and generates distributed feedback with respect to said propagating light.

3. The device according to claim 1, wherein periodic gain modulation and index modulation coexist in said light propagation direction, and both of said gain modulation and said index modulation generate distributed feedback with respect to said propagating light.

4. The device according to claim 1, wherein the difference in film characteristics is achieved by at least one of the measures of changing the material composition, of doping with p- or n-type impurities, and of introducing compressive or tensile strain.

5. The device according to claim 1, wherein each well layer in said second multiple quantum well layers is thinner than that in said first multiple quantum well layers.

6. The device according to claim 1, wherein the bandgap of each well layer in said second multiple quantum well layers is wider than that in said first multiple quantum well layers.

7. The device according to claim 1, wherein the barrier height of each barrier layer in said second multiple quantum well layers is higher than that in said first multiple quantum well layers.

8. The device according to claim 5, wherein the injected carrier density in said first multiple quantum well layers is higher than that in said second multiple quantum well layers.

9. The device according to claim 5, wherein no phase shift is contained in a region where periodic gain modulation or index modulation exists.

10. The device according to claim 1, wherein each well layer in said second multiple quantum well layers is thicker than that in said first multiple quantum well layers.

11. The device according to claim 1, wherein the bandgap of each well layer in said second multiple quantum well layers is narrower than that in said first multiple quantum well layers.

12. The device according to claim 1, wherein the barrier height of each barrier layer in said second multiple quantum well layers is lower than that in said first multiple quantum well layers.

13. The device according to claim 10, wherein the injected carrier density in said first multiple quantum well layers is lower than that in said second multiple quantum well layers.

14. The device according to claim 1, wherein the differential gain in said first multiple quantum well layers is lower than that in said second multiple quantum well layers.

15. The device according to claim 14, wherein the gain peak wavelength of said first multiple quantum well layers is shorter than the lasing wavelength, and the gain peak wavelength of said second multiple quantum well layers is longer than said lasing wavelength.

16. The device according to claim 15, wherein each well layer in said first multiple quantum well layers is thinner than that in said second multiple quantum well layers.

17. The device according to claim 15, wherein the composition wavelength of each well layer in said first multiple quantum well layers is shorter than that in said second multiple quantum well layers.

18. The device according to claim 15, wherein the barrier height of each barrier layer in said first multiple quantum well layers is higher than that in said second multiple quantum well layers.

19. The device according to claim 14, wherein tensile strain is introduced in said first multiple quantum well layers, and/or compressive strain is introduced in said second multiple quantum well layers.

20. The device according to claim 14, wherein at least one or more layers constituting said first multiple quantum well layers are doped with n-type impurities, and/or at least one or more layers constituting said second multiple quantum well layers are doped with p-type impurities.

21. The device according to claim 20, wherein an n-type substrate is used, and said first multiple quantum well layers are disposed under said second multiple quantum well layers.

22. The device according to claim 20, wherein a p-type substrate is used, and said first multiple quantum well layers are disposed over said second multiple quantum well layers.

23. The device according to claim 1, wherein strain is introduced in said first multiple quantum well layers, and the gain peak wavelengths of said first and second multiple quantum well layers are equal to each other.

24. The device according to claim 23, wherein compressive strain is introduced in said first multiple quantum well layers, and each well layer in said first multiple quantum well layers is thicker than that in said second multiple quantum well layers.

25. The device according to claim 1, wherein tensile strain is introduced in said first multiple quantum well layers, and each well layer in said first multiple quantum well layers is thinner than that in said second multiple quantum well layers.

26. The device according to claim 1, wherein compressive strain is introduced in said first multiple quantum well layers, and the composition wavelength of each well layer in said first multiple quantum well layers is longer than that in said second multiple quantum well layers.

27. The device according to claim 1, wherein tensile strain is introduced in said first multiple quantum well layers, and the composition wavelength of each well layer in said first multiple quantum well layers is shorter than that in said second multiple quantum well layers.

28. The device according to claim 1, wherein compressive strain is introduced in said first multiple quantum well layers, and the barrier height of each barrier layer in said first multiple quantum well layers is lower than that in said second multiple quantum well layers.

29. The device according to claim 1, wherein tensile strain is introduced in said first multiple quantum well layers, and the barrier height of each barrier layer in said first multiple quantum well layers is higher than that in said second multiple quantum well layers.

30. The device according to claim 1, wherein compressive strain is introduced in said first multiple quantum well layers, and the lattice constant in free space of the material of each well layer in said first multiple quantum well layers is smaller than that in said second multiple quantum well layers.

31. The device according to claim 1, wherein tensile strain is introduced in said first multiple quantum well layers, and the lattice constant in free space of the material of each well layer in said first multiple quantum well layers is greater than that in said second multiple quantum well layers.

* * * * *